United States Patent
Wang et al.

(10) Patent No.: US 11,322,682 B2
(45) Date of Patent: *May 3, 2022

(54) SEMICONDUCTOR STRUCTURE AND METHOD FOR FORMING THE SAME

(71) Applicant: UNITED MICROELECTRONICS CORP., Hsin-Chu (TW)

(72) Inventors: Hui-Lin Wang, Taipei (TW); Chia-Chang Hsu, Kaohsiung (TW); Rai-Min Huang, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/152,703

(22) Filed: Jan. 19, 2021

(65) Prior Publication Data
US 2021/0167282 A1 Jun. 3, 2021

Related U.S. Application Data

(63) Continuation-in-part of application No. 16/541,172, filed on Aug. 15, 2019, now Pat. No. 10,937,946.

(30) Foreign Application Priority Data

Jul. 11, 2019 (CN) .......................... 201910623683.9

(51) Int. Cl.
| H01L 43/12 | (2006.01) |
| H01L 23/544 | (2006.01) |
| H01L 43/02 | (2006.01) |
| H01L 27/22 | (2006.01) |

(52) U.S. Cl.
CPC ............ *H01L 43/12* (2013.01); *H01L 23/544* (2013.01); *H01L 27/222* (2013.01); *H01L 43/02* (2013.01); *H01L 2223/54426* (2013.01)

(58) Field of Classification Search
None
See application file for complete search history.

(56) References Cited

U.S. PATENT DOCUMENTS

| 6,271,602 | B1 | 8/2001 | Ackmann | |
| 6,465,897 | B1 | 10/2002 | Shih | |
| 6,660,612 | B1 | 12/2003 | Chang | |
| 2002/0098707 | A1* | 7/2002 | Ning | H01L 23/544 438/712 |
| 2009/0068843 | A1* | 3/2009 | Yang | G03F 7/70633 438/700 |
| 2016/0093670 | A1 | 3/2016 | Jiang | |

\* cited by examiner

*Primary Examiner* — Khaja Ahmad
(74) *Attorney, Agent, or Firm* — Winston Hsu

(57) ABSTRACT

A semiconductor structure is provided in the present invention, including a substrate having a device region and an alignment mark region defined thereon, a dielectric layer disposed on the substrate, a conductive via formed in the dielectric layer on the device region, a first trench formed in the dielectric layer on the alignment mark, a plurality of second trenches formed in the dielectric layer directly under the first trench and exposed from a bottom surface of the first trench, and a memory stacked structure disposed on the dielectric layer, directly covering a top surface of the conductive via and filling into the first trench and the second trench.

10 Claims, 16 Drawing Sheets

SEMICONDUCTOR STRUCTURE AND METHOD FOR FORMING THE SAME

CROSS REFERENCE TO RELATED APPLICATIONS

This application is a continuation-in-part of U.S. application Ser. No. 16/541,172 filed at Aug. 15, 2019, which is included in its entirety herein by reference.

BACKGROUND OF THE INVENTION

1. Field of the Invention

The present invention generally relates to a semiconductor structure and method for forming the same. More particularly, the present invention relates to a magnetoresistive random access memory (MRAM) and method for forming the same.

2. Description of the Prior Art

A magnetoresistive random access memory (MRAM) is a kind of non-volatile memory that has drawn a lot of attention in this technology field recently regarding its potentials of incorporating advantages of other kinds of memories. For example, an MRAM device may have an operation speed comparable to SRAMs, the non-volatile feature and low power consumption comparable to flash, the high integrity and durability comparable to DRAM. More important, the process for forming an MRAM device may be conveniently incorporated into existing semiconductor manufacturing processes.

A typical MRAM cell structure usually comprises a memory stack structure called magnetic tunnel junction (MTJ) disposed between the lower and upper interconnecting structures. Unlike conventional memories that store data by electric charge or current flow, an MRAM cell stores data by applying external magnetic fields to control the magnetic polarity and tunneling magnetoresistance (TMR) of the MTJ.

However, the manufacturing of MRAM devices is still confronted with challenges. For example, as the cell size of the MRAM becomes smaller to achieve higher density, the alignment accuracy between the MTJ and the interconnecting structures has been more and more critical. Inline misalignment would cause an insufficient contacting area between the bottom electrode of the MTJ and the underlying interconnecting structure, which may result in high series resistance that may obstruct the MRAM to function properly. Therefore, there is still a need in the field to provide a novel MRAM device and method for forming the same that may ensure the alignment accuracy between the MTJ and the interconnecting structures to prevent the aforesaid problems.

SUMMARY OF THE INVENTION

In light of the above, the present invention is directed to provide a semiconductor structure and method for forming the same which may improve the alignment accuracy between the memory cell structure and the underlying interconnecting structure.

One objective of the present invention is to provide a semiconductor structure, which includes a substrate having a device region and an alignment mark region, a dielectric layer disposed on the substrate, a conductive via formed in the dielectric layer on the device region, a first trench formed in the dielectric layer on the alignment mark region, a plurality of second trenches formed in the dielectric layer under the first trench and exposed from a bottom surface of the first trench, and a memory stack structure disposed on the dielectric layer, directly covering a top surface of the conductive via and filling into the first trench and the second trenches.

Another objective of the present invention is to provide a method for forming a semiconductor structure, including the steps of providing a substrate having a device region and an alignment mark region, forming a first dielectric layer on the substrate and a second dielectric layer on the first dielectric layer, forming a conductive via in the second dielectric layer on the device region, forming a mask layer on the second dielectric layer, the mask layer having an opening exposing the second dielectric layer on the alignment mark region, performing a dry etching process through the opening to form a first trench and a plurality of second trenches directly under the first trench, wherein the first trench penetrates through the second dielectric layer and an upper portion of the first dielectric layer, the second trenches are completely in the first dielectric layer and exposed from a bottom surface of the first trench, removing the mask layer, and forming a memory stack structure on the second dielectric layer, wherein the memory stack structure completely covers a top surface of the conductive via and filling into the first trench and the second trenches.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

FIG. 1 to FIG. 14 are schematic diagrams illustrating the steps of forming a semiconductor structure according to one embodiment of the present invention. FIG. 1, FIG. 5, FIG. 11 and FIG. 12 are schematic top views of the semiconductor structure in a plane containing the X-axis and Y-axis. FIG. 2, FIG. 3, FIG. 4, FIG. 6 to FIG. 10, FIG. 13 and FIG. 14 are schematic cross-sectional views of the semiconductor structure in a plane containing the X-axis and Z-axis. The directions of the X-axis and the Y-axis are different, and the Z-axis is perpendicular to the plane containing the X-axis and Y-axis. In an embodiment, the X-axis and the Y-axis are perpendicular. The semiconductor structure, for example, may be a magnetoresistive random access memory (MRAM).

Figure 1:
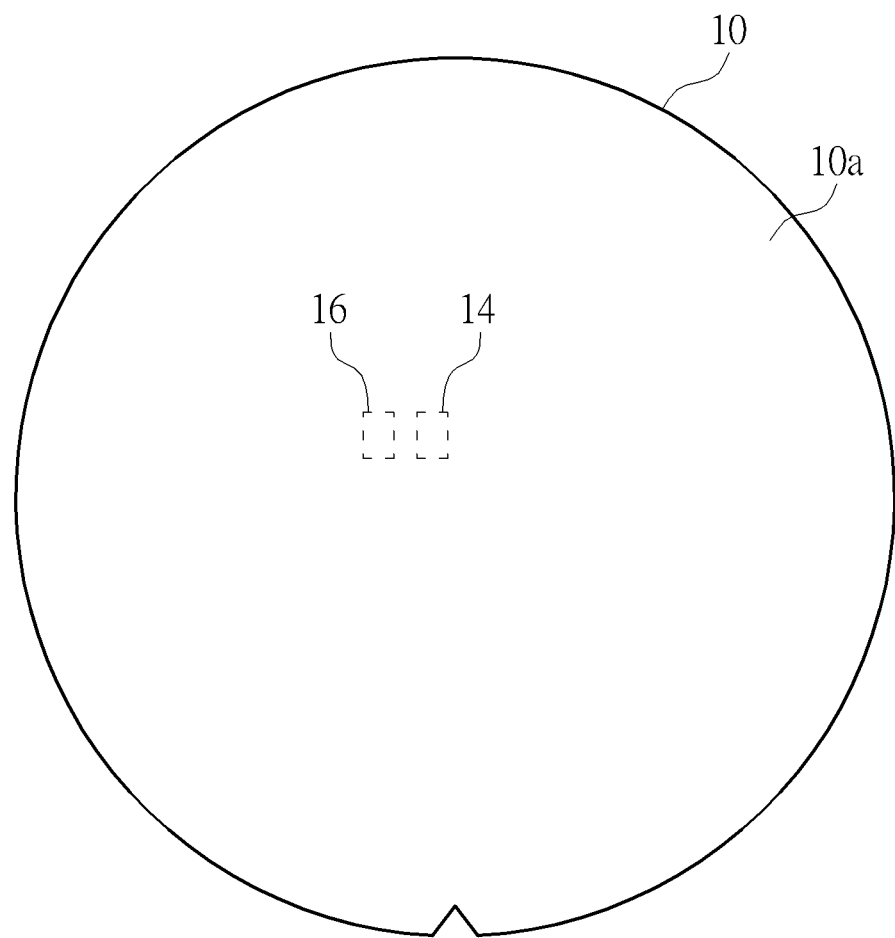
FIG. 1 to FIG. 14 are schematic diagrams illustrating the steps of forming a semiconductor structure according to one embodiment of the present invention.
Figure 1:
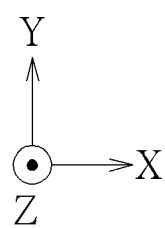
Figure 2:
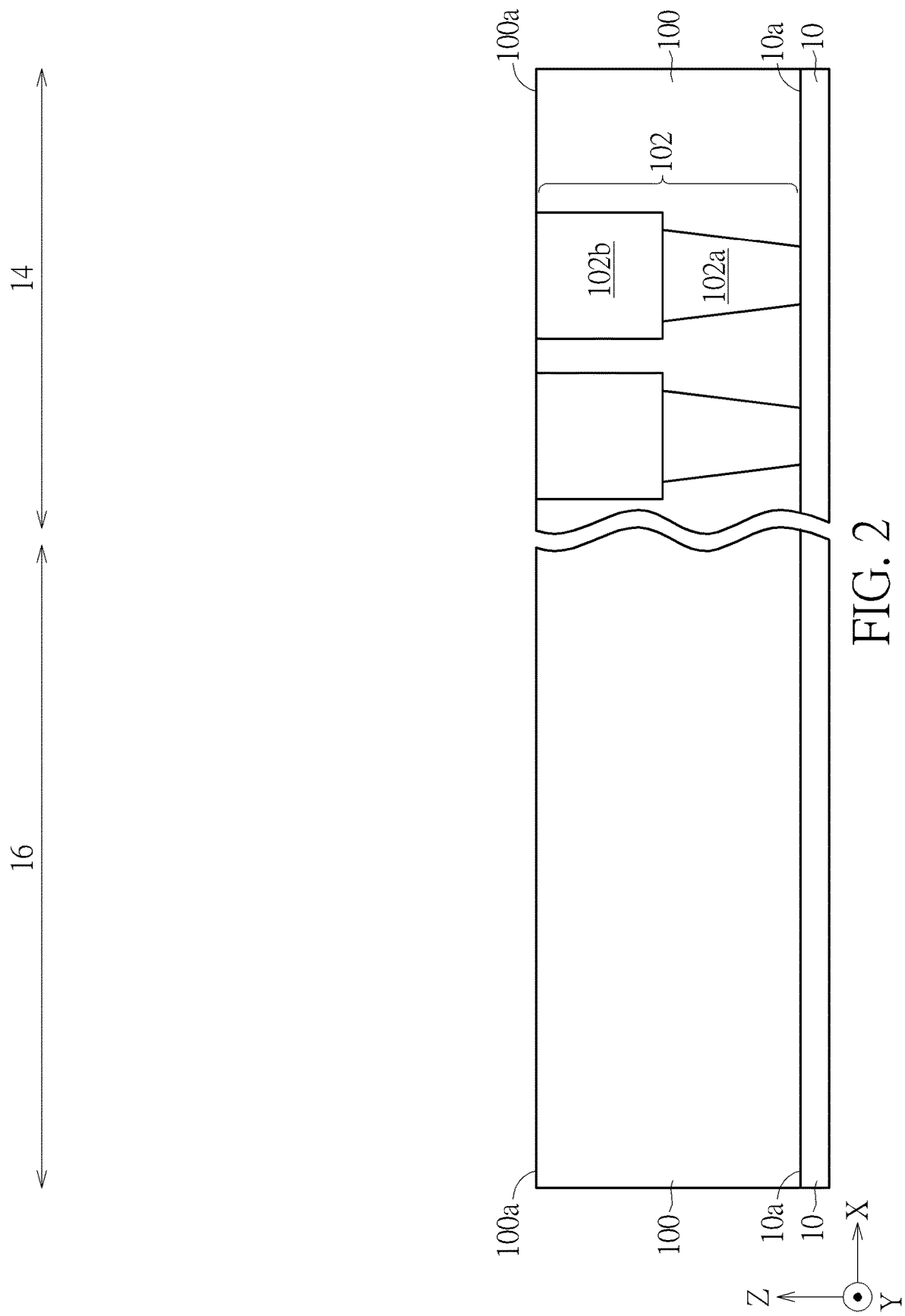

Please refer to FIG. 1 and FIG. 2. As shown in FIG. 1, a substrate 10 having a device region 14 and an alignment mark region 16 defined thereon is provided. The substrate 10 may be a silicon substrate, a silicon-on-insulator (SOI) substrate, or Group III-V semiconductor substrate, but not limited thereto. An upper surface 10a of the substrate 10 is oriented in a plane containing the X-axis and Y-axis. The substrate 10 may comprise semiconductor structures formed therein, such as active devices such as metal-oxide semiconductor (MOS) transistors, passive devices, conductive layers and dielectric layers such as interlayer dielectric layers, which are not shown in the diagrams for the sake of simplification. As shown in FIG. 2, a first dielectric layer 100 is formed on the upper surface 10a of the substrate 10. The first dielectric layer 100 has a planarized upper surface 100a and completely covers the device region 14 and the alignment mark region 16 of the substrate 10. The first dielectric layer 100 may comprise dielectric materials such as silicon oxide or low-k dielectric materials such as fluorinated silica glass (FSG), silicon oxycarbide (SiCOH), spin on glass, porous low-k dielectric material, organic dielectric polymers, or a combination thereof, but not limited thereto. An etching stop layer (not shown) may be disposed between the substrate 10 and the first dielectric layer 100.

Please still refer to FIG. 2. A plurality of interconnecting structures 102 are formed in the first dielectric layer 100 on the device region 14 of the substrate 10. The interconnecting structures 102 may comprise metal such as tungsten (W), copper (Cu), aluminum (Al), or other suitable metals, but not limited thereto. According to an embodiment, the interconnecting structures 102 may comprise copper and may be formed by single-damascene or dual-damascene metallization processes. The interconnecting structures 102 may respectively have a lower portion 102a for electrically connecting to an underlying conductive layer in the substrate 10 and an upper portion 102b disposed on the lower portion 102a for electrically connecting to an overlying interconnecting structure subsequently formed. A barrier layer (not shown) may be disposed between the interconnecting structures 102 and the first dielectric layer 100. The barrier layer may comprise titanium (Ti), tantalum (Ta), titanium nitride (TiN), tantalum nitride (TaN), or a combination thereof, but not limited thereto. It should be noticed that the first dielectric layer 100 on the alignment mark region 16 of the substrate 10 does not have interconnecting structures 102 formed therein.

Figure 3:
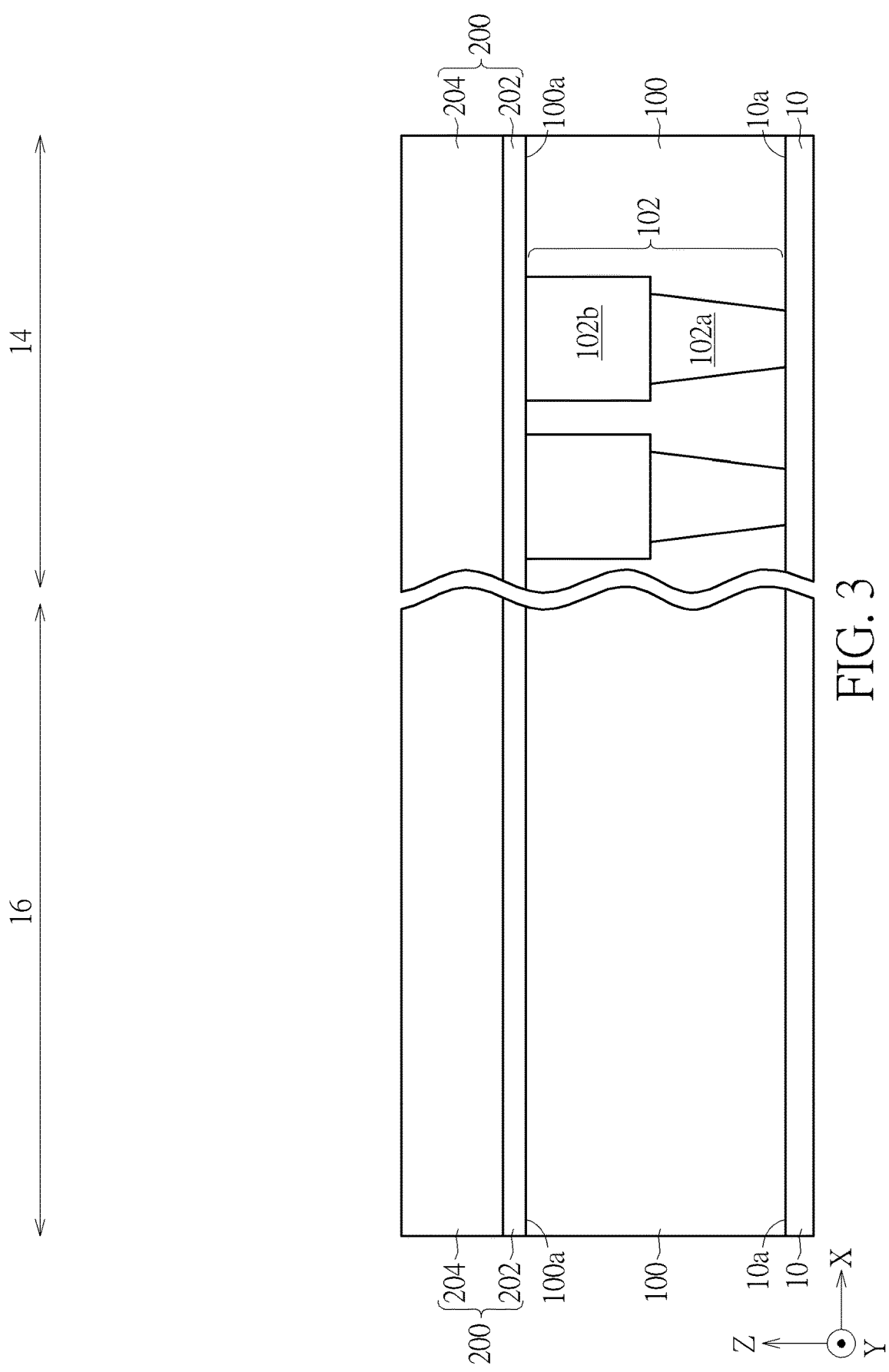

Please refer to FIG. 3. Subsequently, a second dielectric layer 200 is formed on the upper surface 100a of the first dielectric layer 100 and completely covers the device region 14 and the alignment mark region 16. The second dielectric layer 200 may include multiple layers. For example, the second dielectric layer 200 may include an etching stop layer 202 and a dielectric material layer 204 disposed on the etching stop layer 202. The etching stop layer 202 may include dielectric materials such as silicon nitride (SiN), silicon carbon nitride (SiCN) or silicon oxynitride (SiON), or a combination thereof, but not limited thereto. The dielectric material layer 204 may include dielectric materials such as silicon oxide or low-k dielectric materials such as fluorinated silica glass (FSG), silicon oxycarbide (SiCOH), spin on glass, porous low-k dielectric material, organic dielectric polymers, or a combination thereof, but not limited thereto. According to the embodiment, the first dielectric layer 100 and the second dielectric layer 200 comprise different dielectric materials. For example, the first dielectric layer 100 may comprise low-k dielectric materials; the etching stop layer 202 of the second dielectric layer 200 may comprise SiCN, and the dielectric material layer 204 may comprise silicon oxide.

Figure 4:
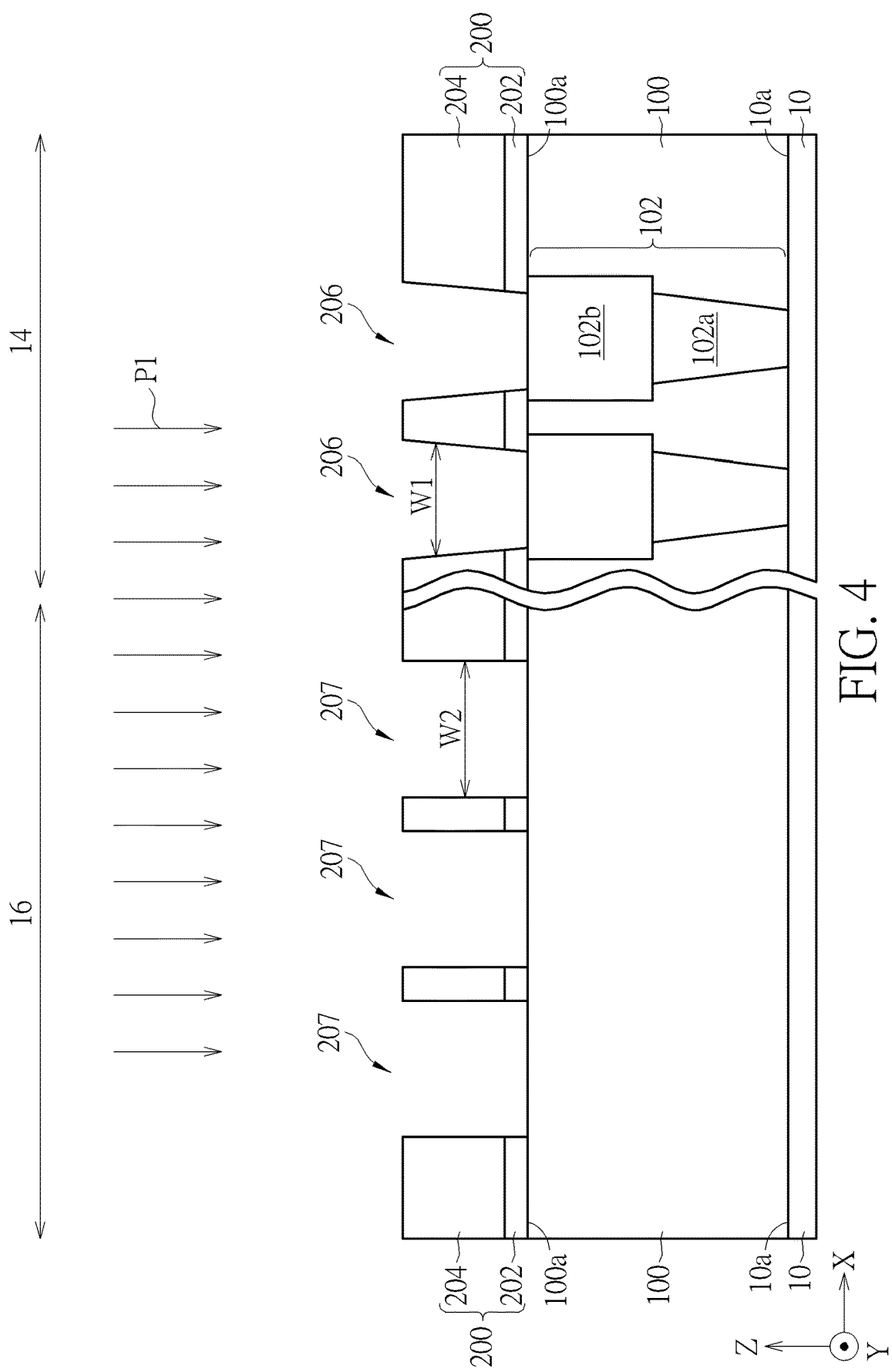
Figure 5:
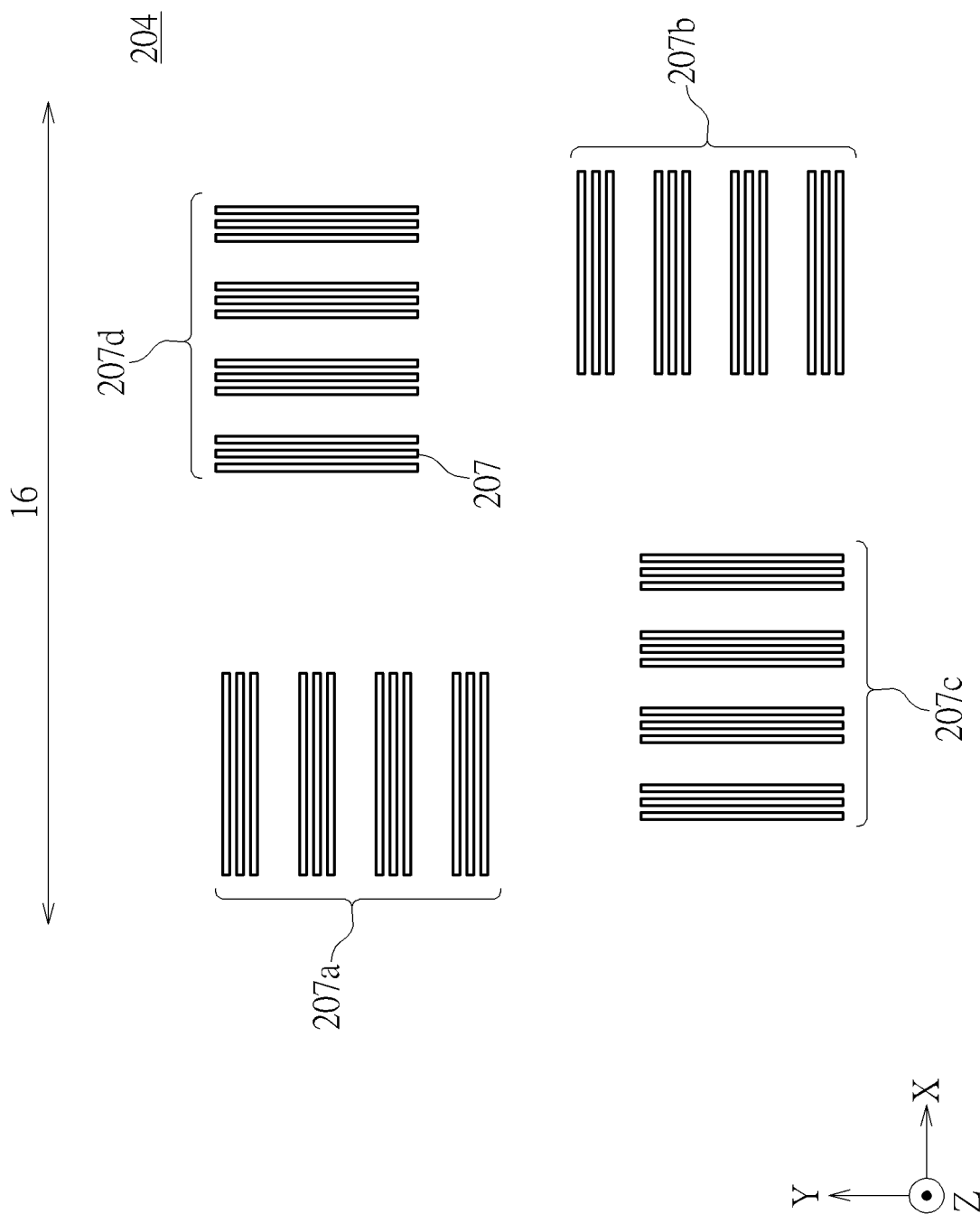

Please refer to FIG. 4 and FIG. 5. Subsequently, a patterning process P1 such as a photolithography-etching process is performed to simultaneously define a plurality of via holes 206 in the second dielectric layer 200 on the device region 14 and a plurality of openings such as trenches 207 in the second dielectric layer 200 on the alignment mark region 16. The via holes 206 are aligned to the interconnecting structures 102, respectively, and extend downwardly through the second dielectric layer 200 to expose top surfaces of the interconnecting structures 102. The trenches 207 extend downwardly through the second dielectric layer 200 and expose the upper surface 100a of the first dielectric layer 100. In some embodiments, the trenches 207 may extend further into an upper portion of the first dielectric layer 100 and may have bottom surfaces lower than the upper surface 100a of the first dielectric layer 100. As shown in FIG. 4, the via holes 206 may have a same width W1, and the trenches 207 may have a same width W2. It should be noted that the width W1 and the width W2 shown in FIG. 4 are not drawn to scale for illustrative purposes. According to an embodiment, the width W2 is multiple times larger than the width W1. For example, the width W1 of the via holes 206 is between 15 nm to 25 nm, and the width W2 of the trenches 207 is between 200 to 400 nm.

Please refer to FIG. 5. It is noteworthy that the trenches 207 are arranged to according to a designed pattern of an alignment mark feature used in a subsequent patterning process P3 (shown in FIG. 14). For example, as shown in FIG. 5, the trenches 207 are arranged approximately in a rectangle region of the second dielectric layer 200 and are divided into groups 207a, 207b, 207c and 207d. The groups 207a and 207b are positioned at two opposite corners of the rectangle region and the trenches 207 of the groups 207a and 207b extend lengthwisely along direction of the X-axis and are arranged in parallel along direction of the Y-axis. On the other hand, the groups 207c and 207d are positioned at the other two opposite corners of the rectangle region and the trenches 207 of the groups 207c and 207d extend lengthwisely along direction of the Y-axis and are arranged in parallel along direction of the X-axis. According to an embodiment, all of the trenches 207 comprise a same width W2 and a same length. In other embodiments, the trenches 207 of different groups may have different widths or lengths. The trenches 207 shown in the left portion of FIG. 4 may be three successively arranged trenches 207 of the group 207c shown in FIG. 5, for example.

Figure 6:
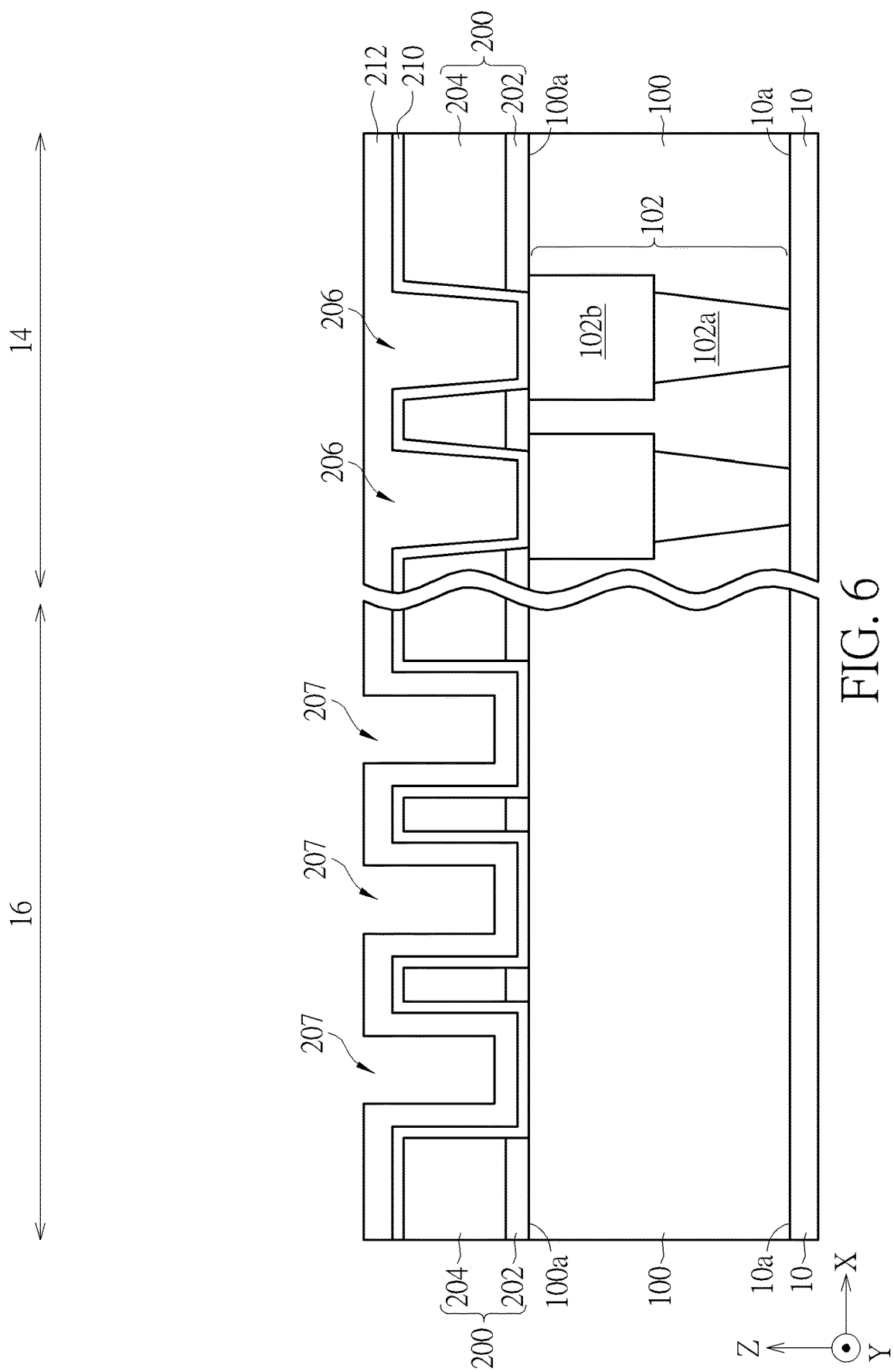

Please refer to FIG. 6. Subsequently, a barrier layer 210 is formed on the second dielectric layer 200. The barrier layer 210 conformally covers the upper surface of the second dielectric layer 200, the bottom surfaces and sidewalls of the via holes 206 and the trenches 207. A conductive material 212 is then deposited on the barrier layer 210 and completely fills the via holes 206. According to an embodiment, the barrier layer 210 may comprise single layer or multiple layers formed by atomic layer deposition (ALD) process. The material of the barrier layer 210 may comprise titanium (Ti), tantalum (Ta), titanium nitride (TiN), tantalum nitride (TaN), or a combination thereof, but not limited thereto. The conductive material 212 may be formed by chemical vapor deposition (CVD) process, physical vapor deposition (PVD) process or electroplating process and may comprise metal such as tungsten (W), copper (Cu), or aluminum (Al), but not limited thereto. It should be noticed that due to the larger width of the trenches 207, the thickness of the conductive material 212 is able to completely fill the via holes 206 but without filling up the trenches 207. According to an embodiment when the width W1 of the via holes 206 is between 15 nm to 25 nm, the thickness of the conductive material 212 is between 500 Å to 700 Å, but not limited thereto. The sidewalls and bottom surfaces of the trenches 207 are covered by the barrier layer 210 and the conductive material 212.

Figure 7:
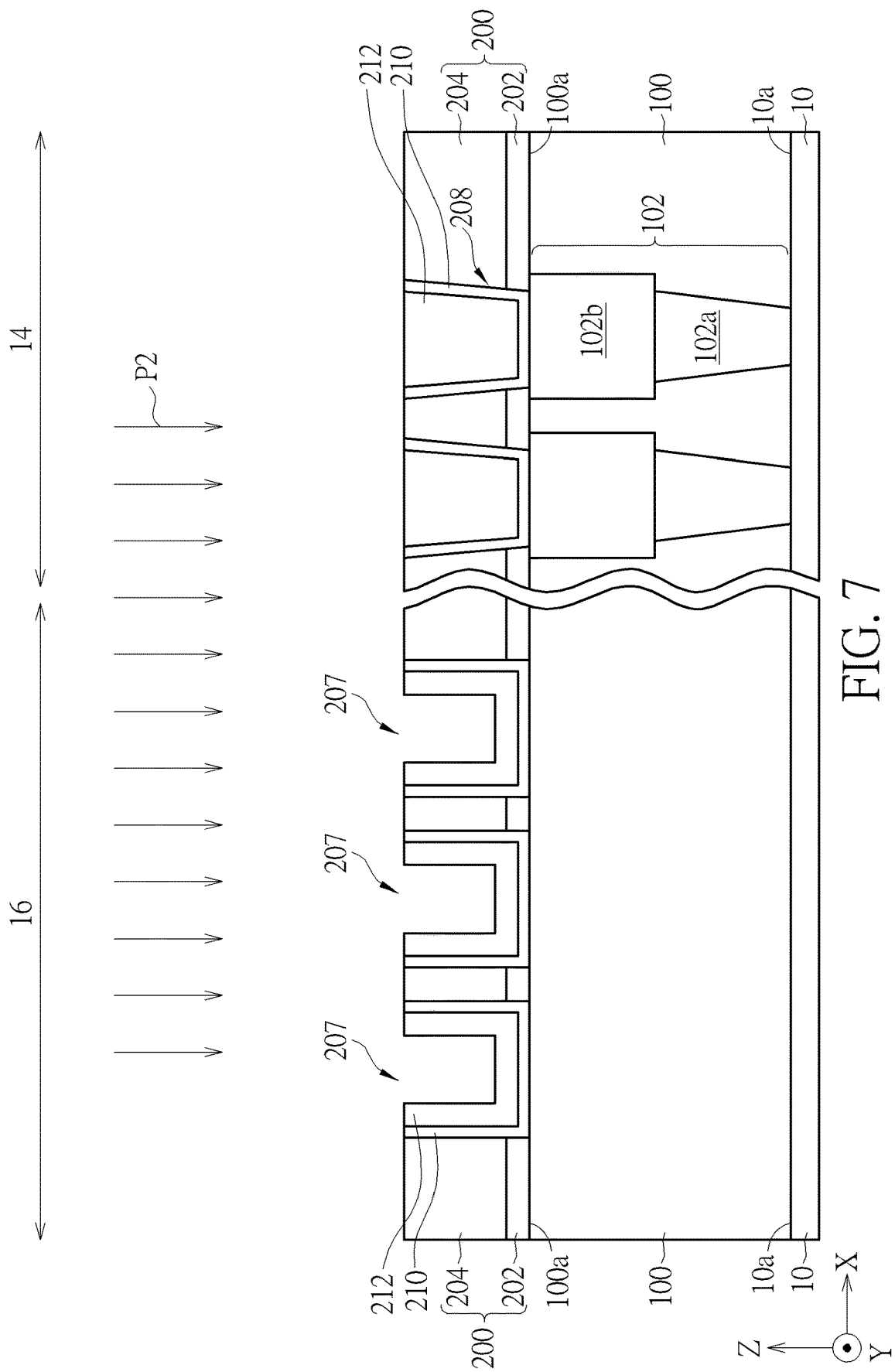

Please refer to FIG. 7. Afterward, a chemical mechanical polishing (CMP) process P2 is performed to planarize the conductive material 212 and remove unnecessary conductive material 212 and barrier layer 210 outside the via holes 206 and the trenches 207 until exposing a surface of the second dielectric layer 200. The conductive material 212 and barrier layer 210 remained in the via holes 206 form the conductive vias 208, which are used to provide electrical interconnection between the subsequently formed memory cell structures 330 and the interconnecting structures 102. After the chemical mechanical polishing process P2, the sidewalls and bottom surfaces of the trenches 207 are stilled covered by the barrier layer 210 and the conductive material 212.

Figure 8:
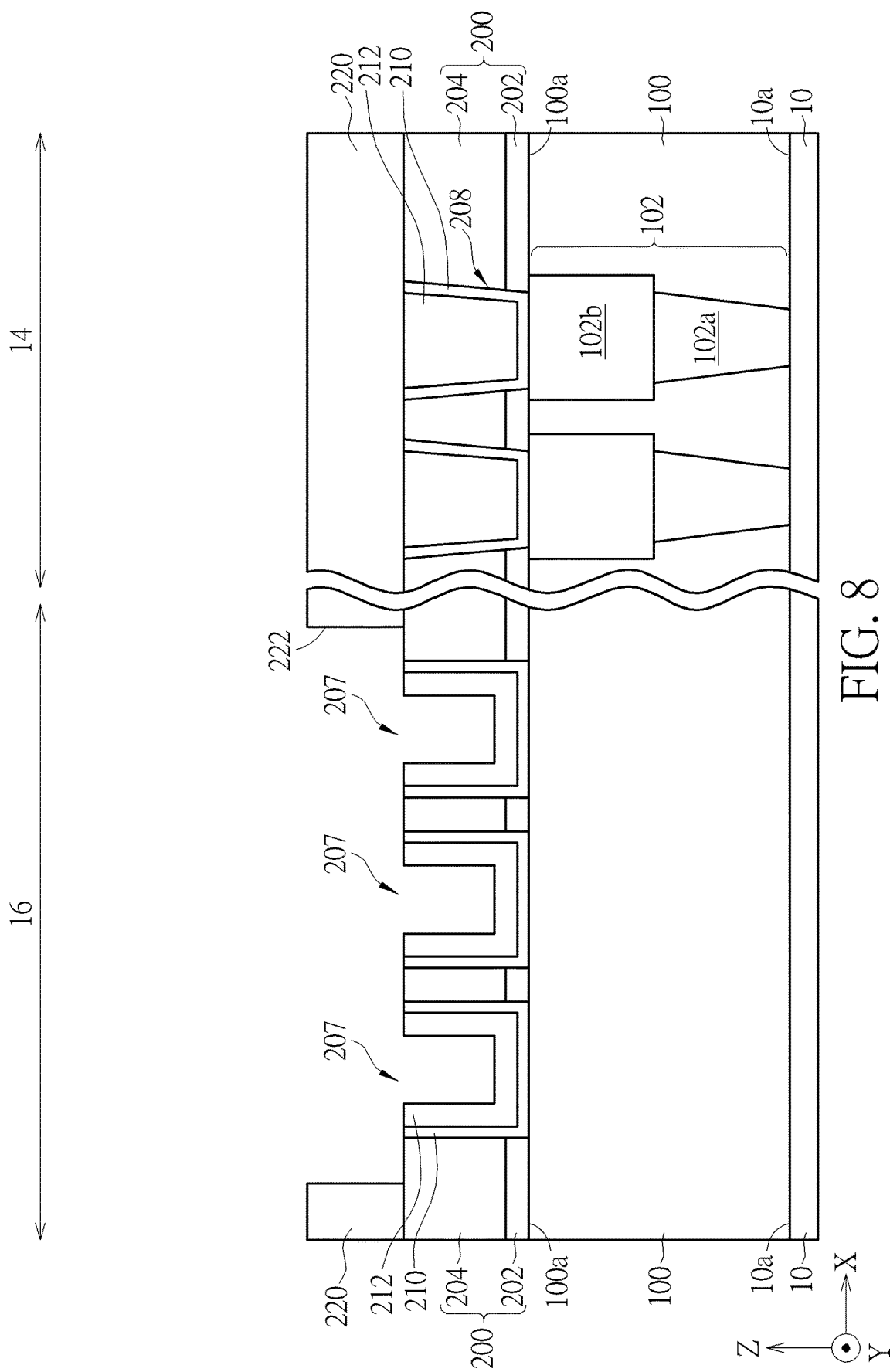

Please refer to FIG. 8. Next, a mask layer 220 such as a patterned photoresist layer or a patterned hard mask layer is formed on the second dielectric layer 200. An opening 222 is formed in the mask layer 220 on the alignment mark region 16 to expose the trenches 207 and a portion of the second dielectric layer 200 nearby the trenches 207. The conductive vias 208 and the second dielectric layer 200 on the device region 14 are completely covered by the mask layer 220 and not exposed.

Figure 9:
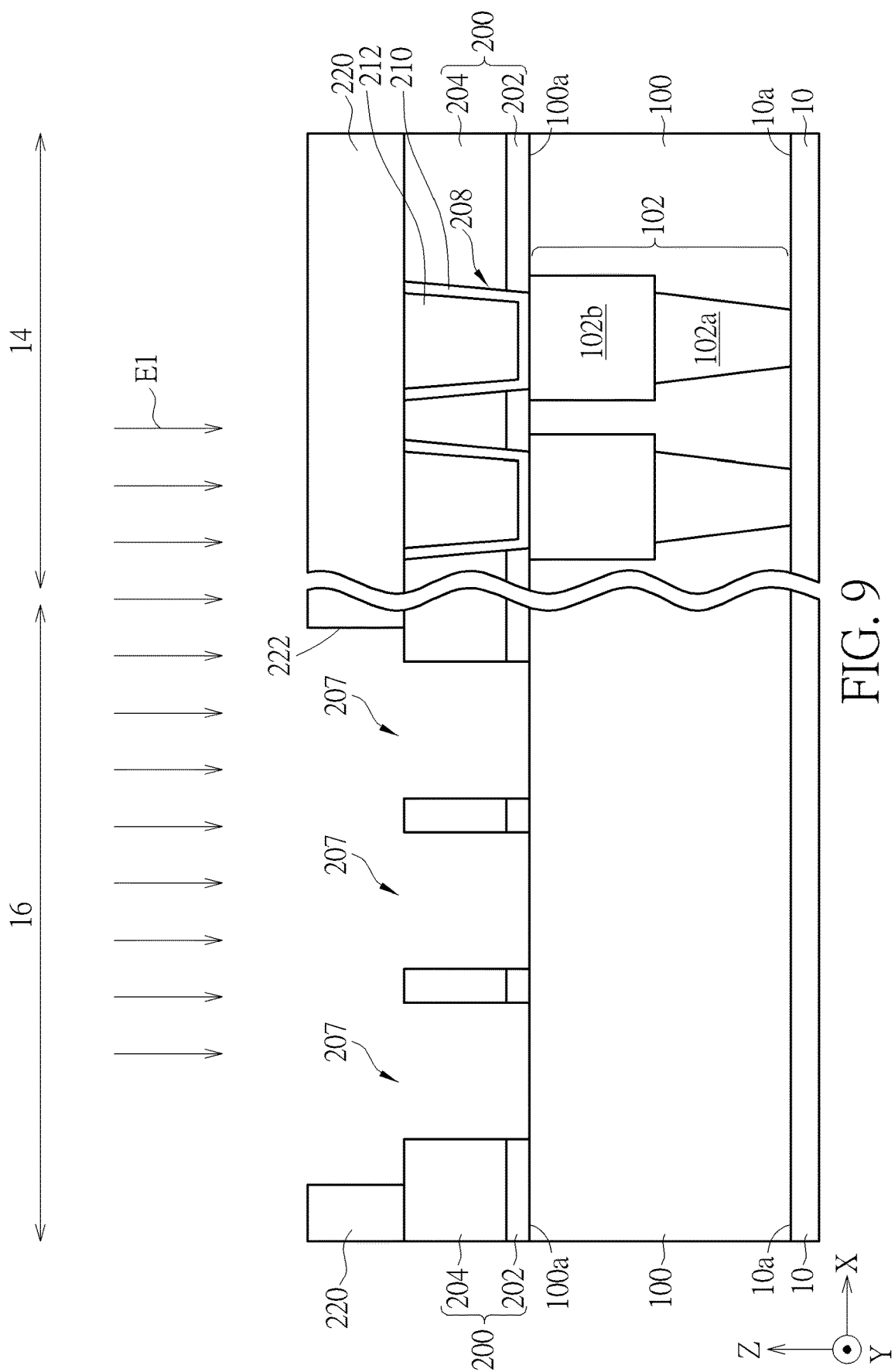

Please refer to FIG. 9. After forming the mask layer 220, optionally, a wet etching process E1 may be performed to remove the barrier layer 210 and the conductive material 212 in the trenches 207.

Figure 10:
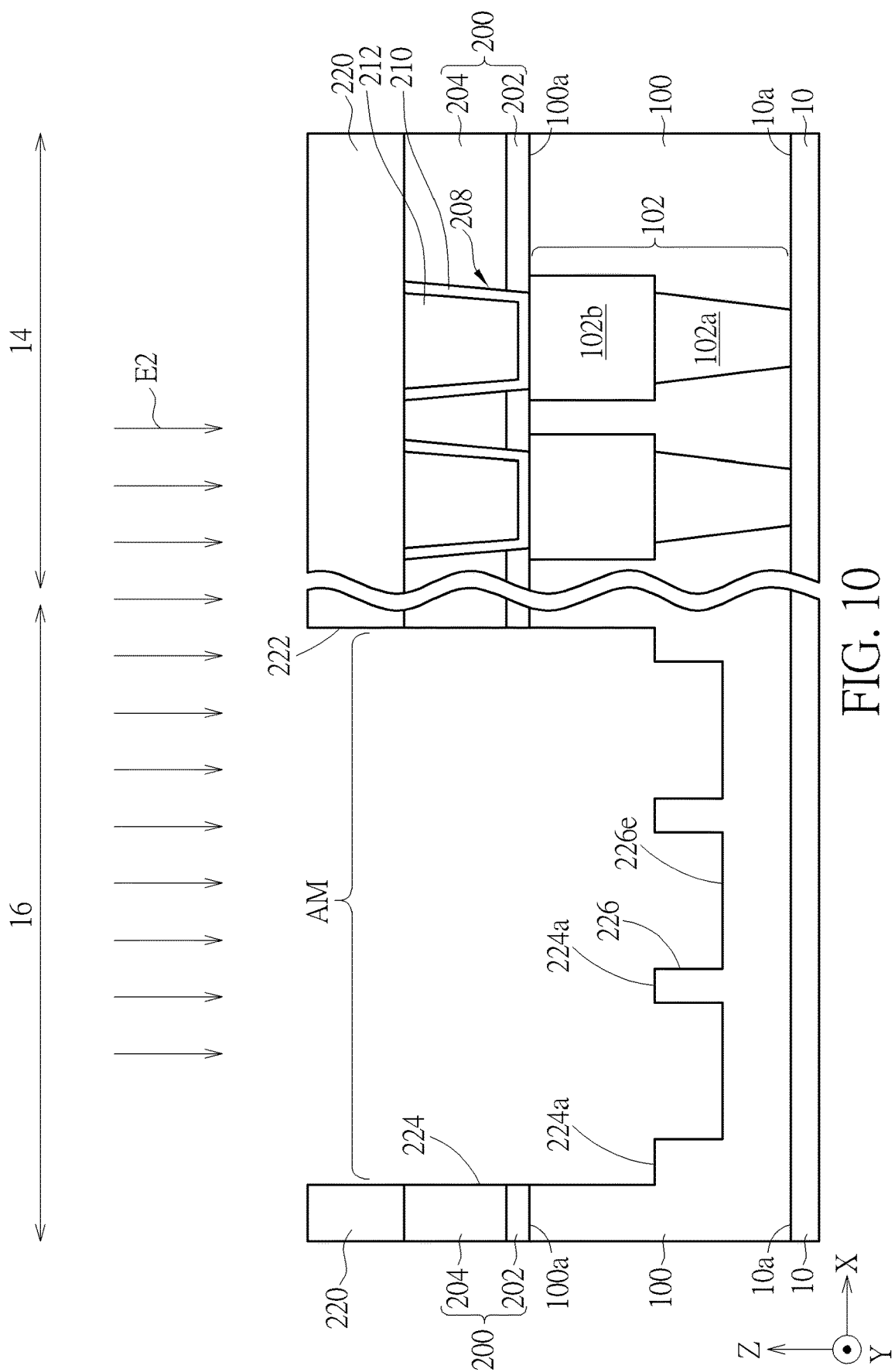
Figure 11:
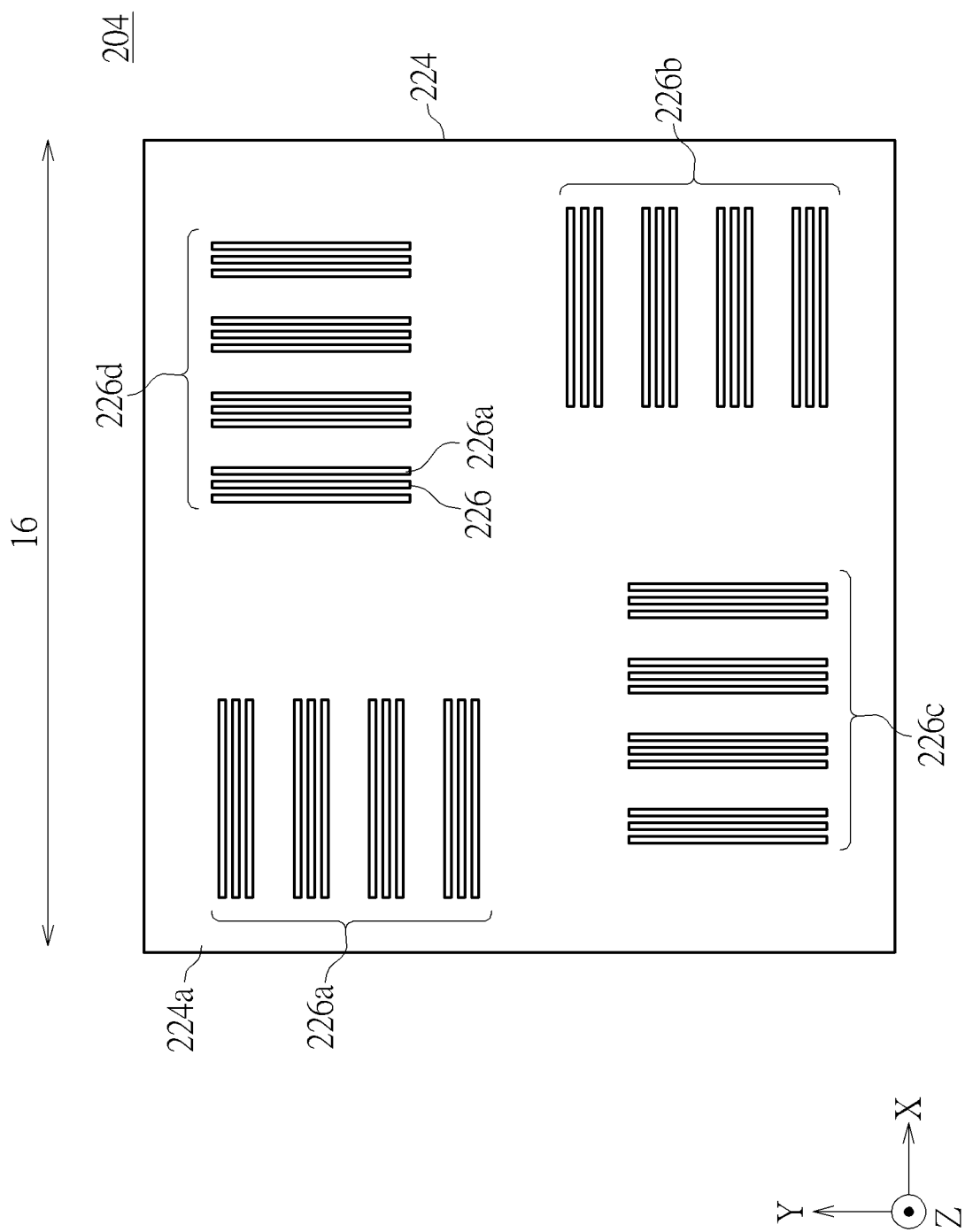
Figure 12:
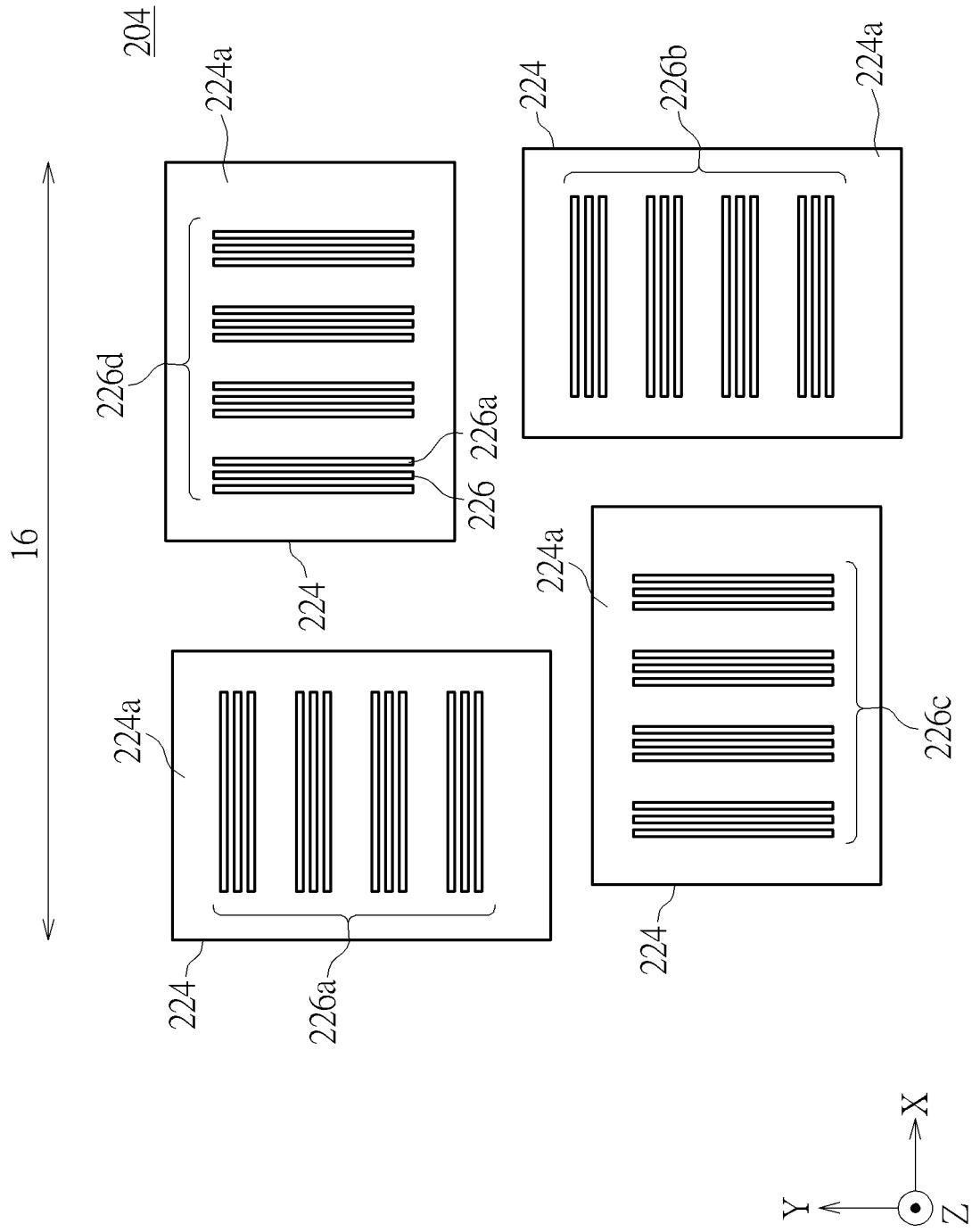

Please refer to FIG. 10, FIG. 11 and FIG. 12. Subsequently, a dry etching process E2 is performed using the mask layer 220 as an etching mask to etch away the second dielectric layer 200 and the first dielectric layer 100 exposed from the opening 222 so as to transfer the pattern of the opening 222 downwardly into the second dielectric layer 200 and the first dielectric layer 100 to form a first trench 224 penetrating through the whole thickness of the second dielectric layer 200 and an upper portion of the first dielectric layer 100. According to an embodiment, the dry etching process E2 may be an ion beam etching (IBE) process or a reactive ion etching (ME) process, but not limited thereto. It is noteworthy that during the dry etching process E2, the portion of the second dielectric layer 200 exposed from the opening 222 acts as an etching buffer layer for the underneath first dielectric layer 100 during the dry etching process E2. As a result, the removed thickness of the first dielectric layer 100 covered by the second dielectric layer 200 is smaller than the removed thickness of the first dielectric layer 100 exposed from the first trenches 207. Accordingly, the patterns of the trenches 207 are transferred downwardly into the first dielectric layer 100 to form a plurality of second trenches 226 directly under the first trench 224.

As shown in FIG. 10, a bottom surface 224a of the first trench 224 exposes the first dielectric layer 100 and is lower than a bottom of the conductive vias 208. According to an embodiment, the bottom surface 224a of the first trench 224 is approximately at a same horizontal level with respect to a bottom of the upper portion 102b of the interconnecting structure 102 in the device region 14. The second trenches 226 are formed in the first dielectric layer 110 directly under the first trench 224 and are exposed from the bottom surface 224a of the first trench 224. The bottoms of the second trenches 226 expose the first dielectric layer 100 without exposing any portion of the substrate 10. In other words, the second trenches 226 are completely formed in and surrounded by the first dielectric layer 110 and the overall depth of the first trench 224 and the second trenches 226 do not penetrate through the first dielectric layer 110.

After the dry etching process E2, the mask layer 220 is completely removed and the top surface of the interconnecting structures 102 and the second dielectric layer 200 on the device region 400 are exposed.

Please refer to FIG. 11 and FIG. 12. Because the patterns of the second trenches 226 are defined by the trenches 207, the arrangement of the second trenches 226 are the same as the arrangement of the trenches 207 as shown in FIG. 5. Specifically, the second trenches 226 are divided into groups 226a, 226b, 226c and 226d. The second trenches 226 of the groups 226a and 226b extend lengthwisely along direction of the X-axis and are arranged in parallel along direction of the Y-axis. On the other hand, the second trenches 226 of the groups 226c and 226d extend lengthwisely along direction of the Y-axis and are arranged in parallel along direction of the X-axis. As previously mentioned, the trenches 207 are arranged according to a designed pattern of an alignment mark feature. Therefore, the second trenches 226 defined by the trenches 207 would form an alignment feature AM. In the embodiment as shown in FIG. 11, the groups 226a, 226b, 226c and 226d are exposed from the bottom surface 224a of same first trench 224. That is, the groups 226a, 226b, 226c and 226d are formed directly under the bottom surface 224a of a same first trench 224. However, in another embodiment as shown in FIG. 12, the groups 226a, 226b, 226c and 226d may be respectively exposed from the bottom surfaces 224a of different first trenches 224. That is, the mask layer 220 on the alignment mark region 16, as shown in FIG. 8 and FIG. 9, may have plural openings 222 respectively exposing one of the groups 207a, 207b, 207c, 207d of the trenches 207 and plural first trenches 224 may be formed by performing the dry etching process E2 through the openings 222 to etch the second dielectric layer 200 and the first dielectric layer 100.

Figure 13:
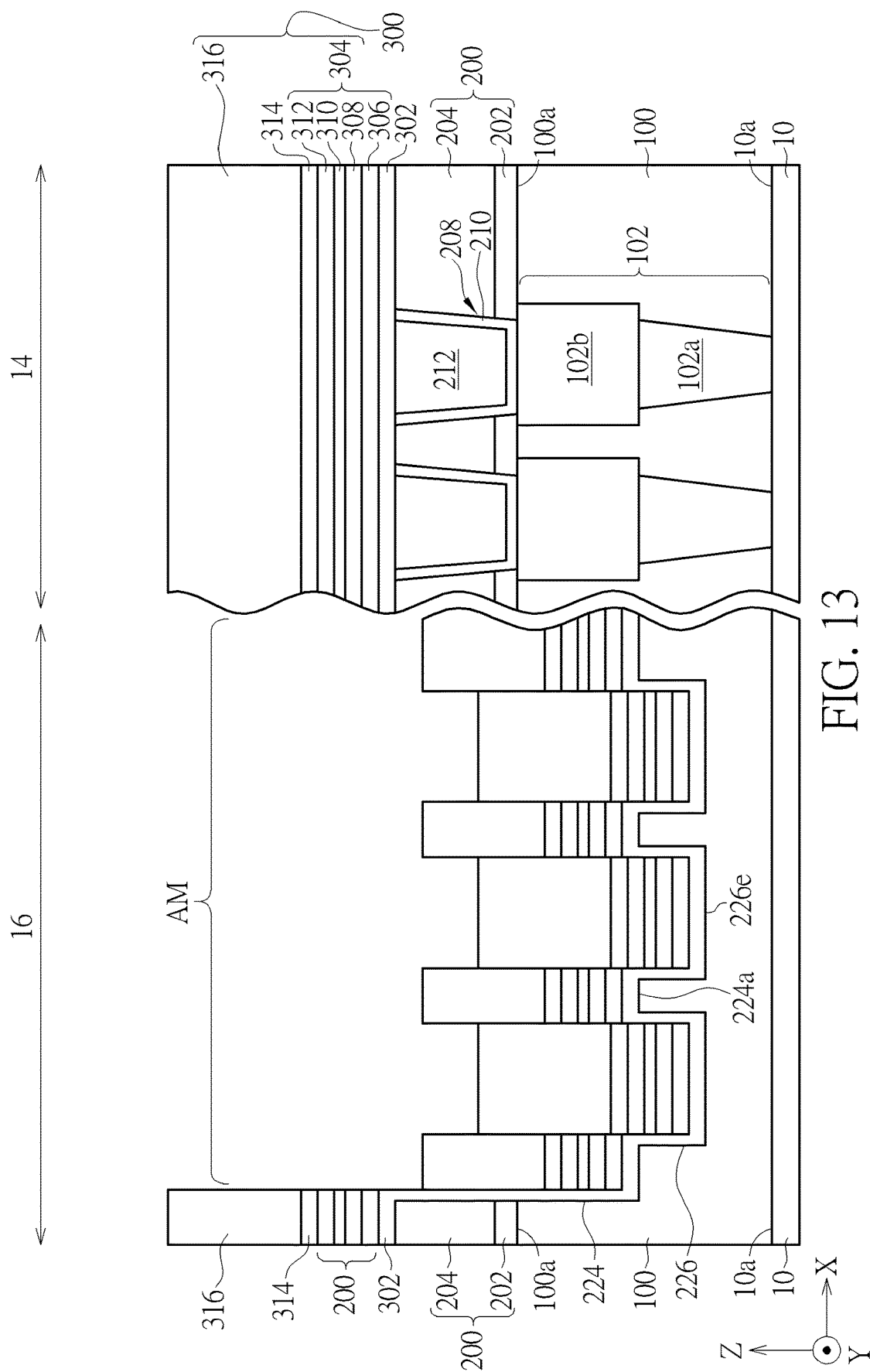

Please refer to FIG. 13. Subsequently, a memory stack structure 300 is formed on the second dielectric layer 200, completely covers the device region 14 and the alignment mark region 16 and fills into the first trench 226 and the second trenches 226. The memory stack structure 300 may comprise a magnetoresistive random access memory (MRAM) structure including, from bottom to top, a bottom electrode layer 302, a pinning layer 306, a pinned layer 308, a tunneling layer 310, a free layer 312, a cap layer 314 and a top electrode layer 316 are successively formed on the interlayer dielectric layer 200. According to an embodiment, the bottom electrode layer 302 and the top electrode layer 316 may comprise a same or different conductive material such as titanium, tantalum, titanium nitride, tantalum nitride or a combination thereof, but not limited thereto. The cap layer 314 may comprise a metal or a metal oxide such as aluminum (Al), magnesium (Mg), tantalum (Ta), ruthenium (Ru), tungsten dioxide (WO2), NiO, MgO, Al2O3, Ta2O5, MoO2, TiO2, GdO, or MnO, or a combination thereof, but not limited thereto. The pinning layer 306 is disposed on the bottom electrode layer 302 and may comprise anti-ferromagnetic (AFM) material such as PtMn, IrMn, PtIr or the like. The pinned layer 308 and the free layer 312 respectively comprise a same or different ferromagnetic material such as Fe, Co, Ni, FeNi, FeCo, CoNi, FeB, FePt, FePd, CoFeB, or the like. The magnetic polarity of the pinned layer 308 is pinned (anti-ferromagnetic coupled) to a fixed orientation by the pinning layer 306 thereunder. The magnetic polarity of the free layer 312 may be changed by an external magnetic field. The tunneling layer 310 is sandwiched between the pinned layer 308 and the free layer 312 and may comprise insulating material such as MgO, Al2O3, NiO, GdO, Ta2O5, MoO2, TiO2, WO2, or the like. The pinning layer 306, the pinned layer 308, the tunneling layer 310 and the free layer 312 together form a magnetic tunneling junction (MTJ) material layer 304 between the top electrode layer 316 and the bottom electrode layer 302 and may respectively comprise single or multiple layers having a thickness ranges from several angstroms to dozens of nanometers.

As shown in FIG. 13, the memory stack structure 300 on the alignment mark region 16 completely fills the second trenches 226 but does not fill up the first trench 224. The memory stack structure 300 may reproduce the topography of the bottom surface 224a of the first trench 224, the sidewalls and the bottom surfaces 226a of the second trenches 226 and has a battlement cross-sectional profile. In other words, a top surface of the memory stack structure 300 on the alignment mark region 16 may still show the pattern of the alignment feature AM.

Figure 14:
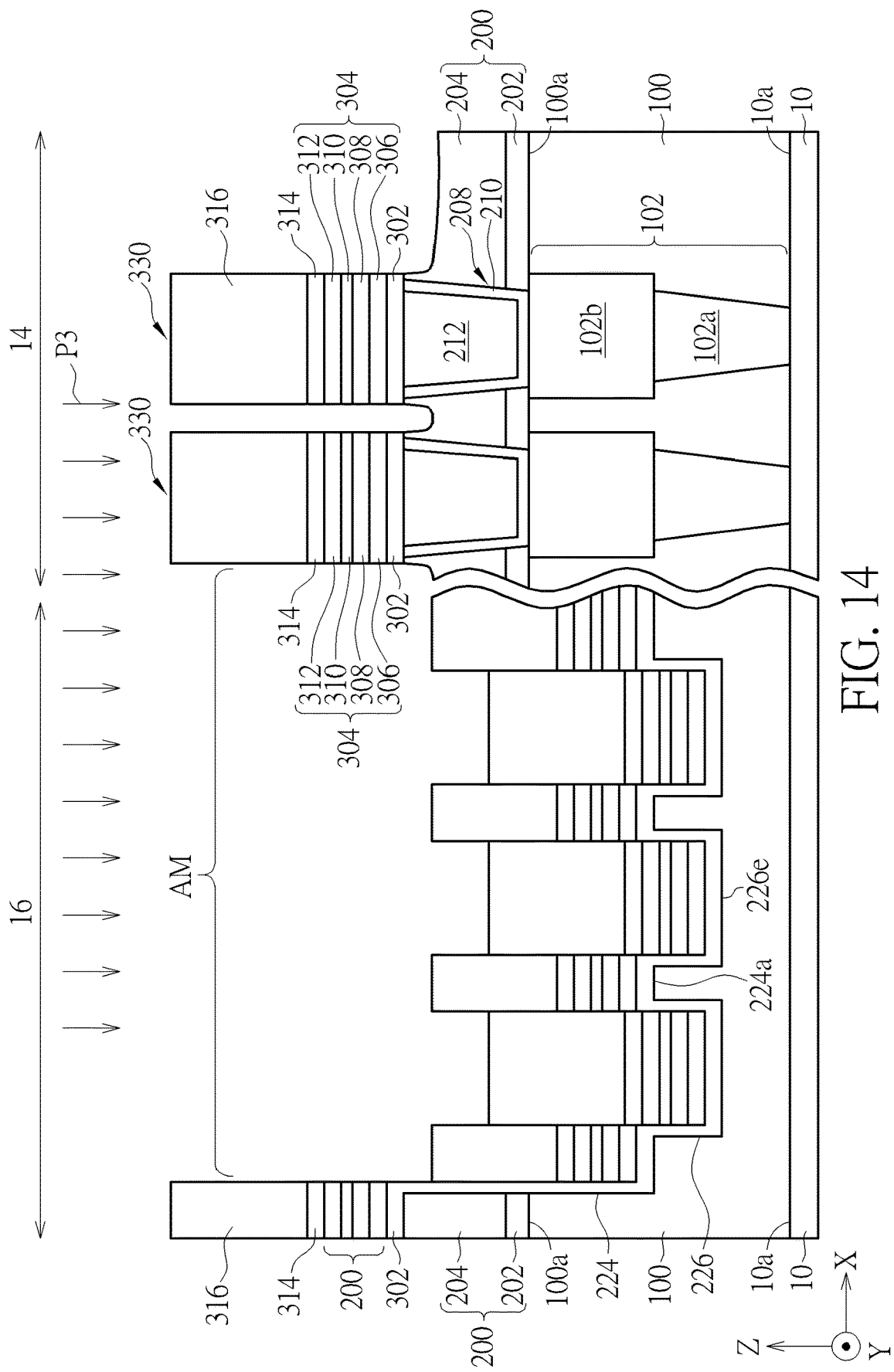

Please refer to FIG. 14. Thereafter, a patterning process P3 is performed to pattern the memory stack structure 300 to form the memory cell structures 330 on the device region 14. According to an embodiment, the patterning process P3 may comprise the following steps. First, a hard mask layer (not shown) may be formed on the top electrode layer 316. A photolithography-etching process, for example, is then performed to pattern the hard mask layer and define the patterned of the memory cell structures 330 in the hard mask layer. Subsequently, an etching process such as a reactive ion etching process is performed using the patterned hard mask as an etching mask to etch and pattern the top electrode layer 316 and the cap layer 314. Another etching process such as an ion beam etching process is carried out using the patterned top electrode layer 316 as an etching mask to etch the underneath magnetic tunneling junction material layer 304 and bottom electrode layer 302 so as to obtain the memory cell structures 330.

The memory cell structures 330 are disposed directly on the conducting vias 208, respectively. The alignment accuracy between the memory cell structures 330 and the conducting vias 208 is critical for the robustness of the electrical interconnection therebetween. The alignment accuracy between the memory cell structures 330 and the conducting vias 208 is determined by the photolithography-etching process of the patterning process P3 for patterning the hard mask layer. A misaligned memory cell structure 330 may have insufficient contacting area between the bottom electrode layer 302 of the memory cell structure 330 and the conducting via 208, which may result in increased serial resistance and cause failure of the magnetoresistive random access memory. One feature of the present invention is that the patterning process P3 is aligned to the alignment mark feature AM comprising the second trenches 226, wherein the patterns of the second trenches 226 are transferred from the patterns of the trenches 207. It is noteworthy that since the trenches 207 and the via holes 206 are defined at the same time by the same patterning process P1 and may have substantially the same alignment offset, the second trenches 226 may also have an alignment offset substantially the same as the via holes 206. Therefore, by aligning to the alignment mark feature AM during the patterning process P3, the obtained memory cell structures 330 may also have an alignment offset substantially the same as the via holes 206 (the conducting vias 208). In this way, the alignment accuracy between the memory cell structures 330 and the conducting vias 208 may be improved and robust electrical connections therebetween may be achieved.

Figure 15:
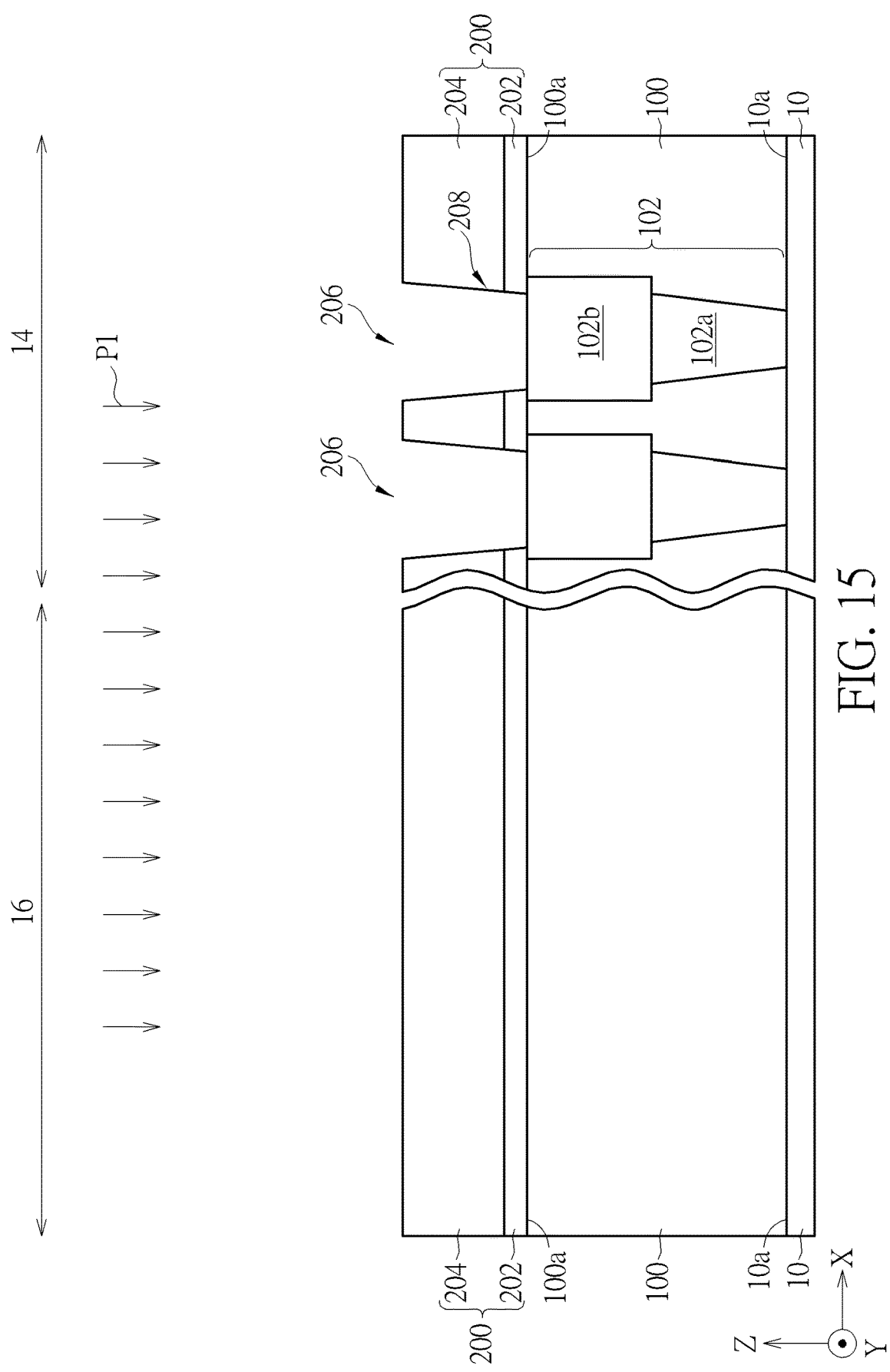
FIG. 15 to FIG. 16 are schematic diagrams illustrating a modification of the embodiment illustrated in FIG. 1 to FIG. 14.
Figure 16:
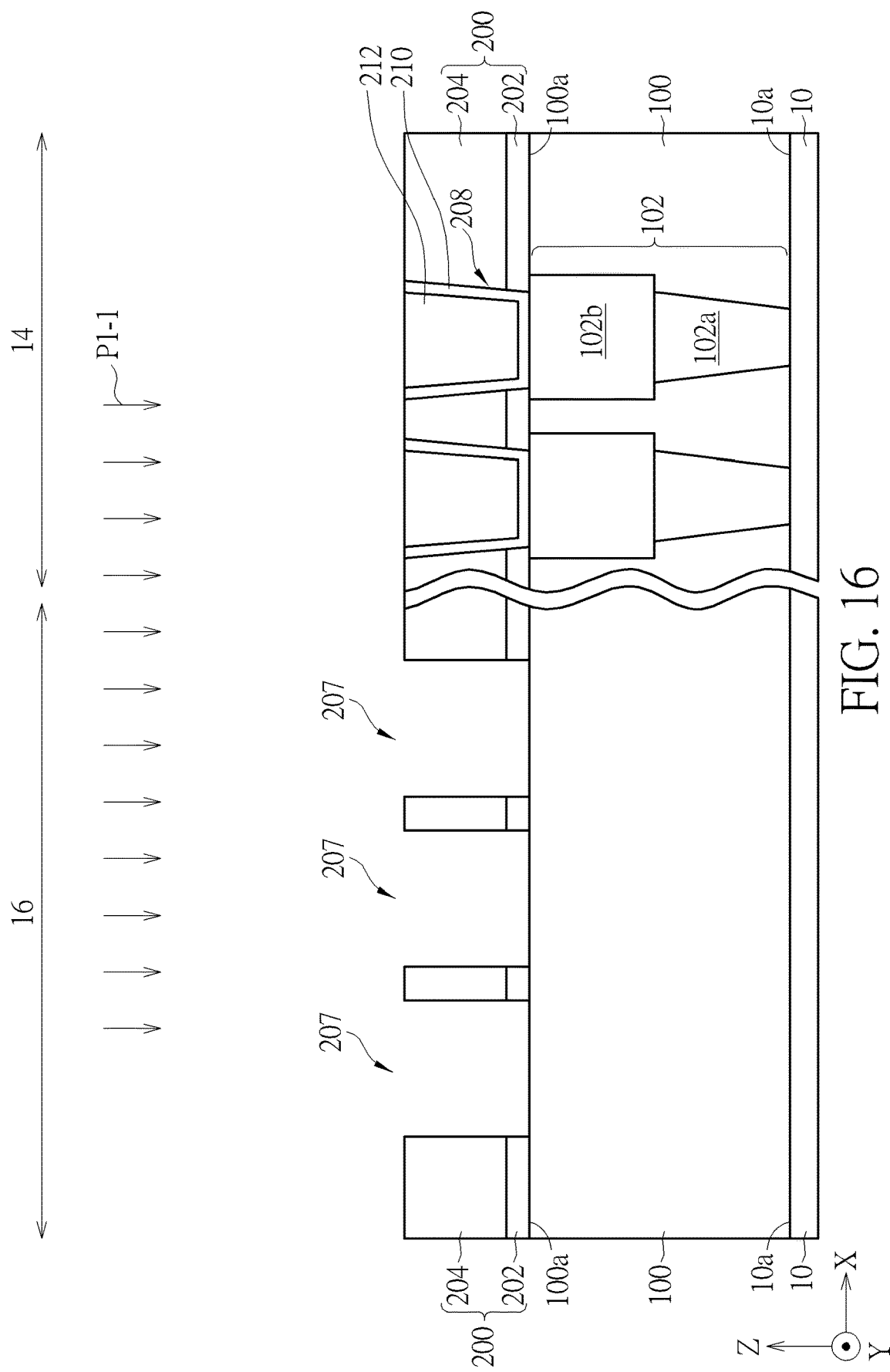

Please refer to FIG. 15 and FIG. 16, which are schematic diagrams illustrating a modification of the embodiment shown in FIG. 1 to FIG. 14. The process from FIG. 15 to FIG. 16 corresponds to the process from FIG. 4 to FIG. 7. As shown in FIG. 15, after forming the second dielectric layer 200, the patterning process P1 is performed to define the via holes 206 in the second dielectric layer 200 on the device region 200. The second dielectric layer 200 on the alignment mark region 16 is not patterned, remains intact and completely covers the first dielectric layer 100 after the patterning process P1. As shown in FIG. 16, after the chemical mechanical polishing process P2 and forming the conductive vias 208 in the via holes 206, another patterning process P1-1 such as a photolithography-etching process is performed to define the trenches 207 in the second dielectric layer 200 on the alignment mark region 16. Afterward, the mask layer 220 having the opening 222 (as shown in FIG. 8) may be formed on the second dielectric layer 200 and the dry etching process E2 (as shown in FIG. 10) may be performed to etch the second dielectric layer 200 and the first dielectric layer 100 through the opening 222. In the modification, the wet etching E1 (as shown in FIG. 9) may be omitted because that the trenches 207 are formed after forming the conductive vias 208 and would not be filled with any conductive material 212 or barrier layer 210.

Overall, the method for forming a magnetoresistive random access memory provided by the present invention includes forming the alignment mark feature AM in the first dielectric layer 100 below the second dielectric layer 200 having the conductive vias 208 formed therein by performing an anisotropic dry etching process E2 after forming the conductive vias 208 and before depositing the memory stack structure 300 to transfer the pattern of the trenches 207 from the second dielectric layer 200 downwardly into the underlying first dielectric layer 100 so as to form the second trenches 226 of the alignment mark feature AM. The alignment mark feature AM is then utilized to pattern the memory stack structure 300 into the memory cell structures 330 to obtain a better alignment accuracy of the memory stack structure 300 and the conductive vias 208. The quality of the electrical interconnections between the memory stack structure 300 and the conductive vias 208 may be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor structure, comprising:
 a substrate having a device region and an alignment mark region;
 a dielectric layer disposed on the substrate;
 a conductive via formed in the dielectric layer on the device region;
 a first trench formed in the dielectric layer on the alignment mark region;

a plurality of second trenches formed in the dielectric layer under the first trench and exposed from a bottom surface of the first trench; and a memory stack structure disposed on the dielectric layer, directly covering a top surface of the conductive via and filling into the first trench and the plurality of second trenches.

2. The semiconductor structure according to claim 1, wherein the memory stack structure comprises a magnetoresistive random access memory (MRAM) structure, and the MRAM comprises:

a bottom electrode layer;

a magnetic tunneling junction (MTJ) layer;

a cap layer; and a top electrode layer.

3. The semiconductor structure according to claim 1, wherein the second trenches form an alignment mark feature, wherein the memory stack structure is patterned by a patterning process aligned to the alignment mark feature.

4. The semiconductor structure according to claim 1, wherein the dielectric layer is not penetrated by the first trench and the second trenches.

5. The semiconductor structure according to claim 1, wherein the bottom surface of the first trench is lower than a bottom surface of the conductive via.

6. The semiconductor structure according to claim 1, wherein the second trenches have a same dimension.

7. The semiconductor structure according to claim 1, wherein some of the second trenches extend along a first direction and arranged in parallel along a second direction, the other second trenches extend along the first direction and arranged in parallel along the second direction, wherein the first direction and the second direction are different.

8. The semiconductor structure according to claim 1, wherein the dielectric layer comprises a first dielectric layer and a second dielectric layer disposed on the first dielectric layer, wherein the first trench penetrates through the whole thickness of the second dielectric layer and an upper portion of the thickness of the first dielectric layer, the second trenches are formed completely in the first dielectric layer directly under the first trench.

9. The semiconductor structure according to claim 8, further comprising an interconnecting structure formed in the first dielectric layer on the device region, wherein the conductive via is in the second dielectric layer vertically over the interconnecting structure and directly contacts the interconnecting structure.

10. The semiconductor structure according to claim 8, wherein the first dielectric layer and the second dielectric layer comprise different dielectric materials.

* * * * *